(12) United States Patent
Okada et al.

(10) Patent No.: US 7,972,714 B2
(45) Date of Patent: Jul. 5, 2011

(54) COATED CUTTING TOOL

(75) Inventors: Yoshio Okada, Itami (JP); Naoya Omori, Itami (JP); Minoru Itoh, Itami (JP); Norihiro Takanashi, Itami (JP); Shinya Imamura, Itami (JP); Susumu Okuno, Itami (JP)

(73) Assignee: Sumitomo Electric Hardmetal Corp., Hyogo (JP)

( * ) Notice: Subject to any disclaimer, the term of this patent is extended or adjusted under 35 U.S.C. 154(b) by 652 days.

(21) Appl. No.: 11/721,520

(22) PCT Filed: Dec. 9, 2005

(86) PCT No.: PCT/JP2005/022636
§ 371 (c)(1),
(2), (4) Date: Jun. 12, 2007

(87) PCT Pub. No.: WO2006/064724
PCT Pub. Date: Jun. 22, 2006

(65) Prior Publication Data
US 2009/0297835 A1    Dec. 3, 2009

(30) Foreign Application Priority Data

Dec. 14, 2004  (JP) ................................ 2004-361652

(51) Int. Cl.
*B23B 27/14* (2006.01)
(52) U.S. Cl. ............ 428/701; 51/307; 51/309; 428/216; 428/325; 428/336; 428/697; 428/698; 428/702
(58) Field of Classification Search .................... 51/307, 51/309; 428/216, 336, 698, 701, 702, 699, 428/697, 325
See application file for complete search history.

(56) References Cited

U.S. PATENT DOCUMENTS

| | | | |
|---|---|---|---|
| 5,250,367 A | | 10/1993 | Santhanam et al. |
| 5,372,873 A | * | 12/1994 | Yoshimura et al. ............ 428/702 |
| 6,015,614 A | * | 1/2000 | Ruppi ............................ 428/698 |
| 6,090,476 A | * | 7/2000 | Thysell et al. ................. 428/698 |
| 6,187,421 B1 | * | 2/2001 | Moriguchi et al. ........... 428/336 |
| 6,200,671 B1 | * | 3/2001 | Lindskog et al. ............. 428/701 |
| 6,350,510 B1 | | 2/2002 | Konig et al. |
| 6,884,496 B2 | * | 4/2005 | Westphal et al. ............. 428/216 |
| 7,090,914 B2 | * | 8/2006 | Yamagata et al. ............ 428/336 |

(Continued)

FOREIGN PATENT DOCUMENTS

EP    0594875 A1    5/1994

(Continued)

OTHER PUBLICATIONS

PCT/JP2005/022636, International Search Report, Mar. 14, 2006.

(Continued)

*Primary Examiner* — Archene Turner
(74) *Attorney, Agent, or Firm* — Ditthavong Mori & Steiner, P.C.

(57) ABSTRACT

The present invention relates to a coated cutting tool (1) including a substrate (8) and a coating (9) formed on the substrate (8), wherein the coating (9) includes a first coating (10) composed of TiCN and a second coating (11) composed of α-Al$_2$O$_3$, the first coating (10) is positioned between the substrate (8) and the second coating (11) and has tensile stress S1, the second coating (11) has compressive stress S2, and the tensile stress S1 and the compressive stress S2 are defined by the following equation (I):

$$400 \text{ MPa} \leq |S2-S1| \leq 3500 \text{ MPa} \qquad (I).$$

7 Claims, 1 Drawing Sheet

U.S. PATENT DOCUMENTS

| | | | |
|---|---|---|---|
| 7,153,562 B2 * | 12/2006 | Rodmar et al. | 428/216 |
| 7,172,807 B2 * | 2/2007 | Fukano et al. | 428/701 |
| 2003/0104254 A1 | 6/2003 | Westphal et al. | |
| 2004/0161639 A1 | 8/2004 | Fukano et al. | |

FOREIGN PATENT DOCUMENTS

| | | |
|---|---|---|
| EP | 0965404 A1 | 12/1999 |
| JP | 5-177411 | 7/1993 |
| JP | 5-177411 A | 7/1993 |
| JP | 5-177412 | 7/1993 |
| JP | 5-177413 | 7/1993 |
| JP | 6-055311 | 3/1994 |
| JP | 06-055311 * | 3/1994 |
| JP | 6-502352 | 3/1994 |
| JP | 9-309007 | 12/1997 |
| JP | 10-015707 | 1/1998 |
| JP | 3087465 | 7/2000 |
| WO | WO 92/05009 | 4/1992 |
| WO | 9923275 A1 | 5/1999 |

OTHER PUBLICATIONS

European Office Action for corresponding EP Application No. 05814749.7, Aug. 18, 2009, UK.

* cited by examiner

COATED CUTTING TOOL

TECHNICAL FIELD

The present invention relates to a cutting tool for a drill, an end mill, an indexable insert for a drill, an indexable insert for an end mill, an indexable insert for milling, an indexable insert for turning, a metal saw, a gear cutting tool, a reamer, and a tap, and particularly to a coated cutting tool with a coated for improving characteristics such as toughness and wear resistance.

BACKGROUND ART

As cutting tools, cemented carbides (WC—Co alloys or WC—CO alloys further containing carbonitride of Ti (titanium), Ta (tantalum), or Nb (niobium) have been used. However, with recent increases in cutting speed, there has been increased the ratio of use of hard alloy tools each including a substrate composed of a cemented carbide, cermet, a sintered cubic boron nitride compact, or an alumina or silicon nitride ceramic, and at least one coating formed on the surface of the substrate by a CVD (Chemical Vapor Deposition) method of a PVD (Physical Vapor Deposition) method using a compound of at least one first element selected from the group IVa elements, Va elements, VIa elements in the periodic table, Al (aluminum), Si, and B and at least one second element selected from B, C, N, and O (when the first element is B alone, the second element is other than B), the thickness of the coating being 3 to 20 µm.

Such cutting tools have a rake face in contact with cutting chips of a work piece in a cutting work and a flank face in contact with the work piece, and a portion (and the vicinity thereof) corresponding to the edge at the crossing of the rake face and the flank face is referred to as an "edge line".

The cutting speed has recently increased for further improving the cutting efficiency, and accordingly, such cutting tools have been required to have higher wear resistance. However, toughness is decreased by the requirement for higher wear resistance, and thus it has been required to satisfy both high wear resistance and high toughness.

As an attempt to comply with the requirement, for example, Japanese Unexamined Patent Application Publication No. 5-177411 (Patent Document 1) pays attention to residual tensile stress a coating layer which occurs when the coating layer is formed on the substrate at a high temperature by the chemical vapor deposition method (CVD method) and then cooled to room temperature, and proposes a measure for overcoming a decrease in toughness of a cutting tool due to the residual tensile stress. Namely, the tensile stress occurs due to a difference between the thermal expansion coefficients of the substrate and the coating layer. The measure uses a method of improving toughness (resistance to fracture) while maintaining high wear resistance, in which a first coating layer having such tensile stress is first formed on the substrate, and a second coating layer having compressive stress is formed on the first coating layer after a predetermined crack is formed in the first coating layer.

Japanese Unexamined Patent Application Publication No. 5-177412 (Patent Document 2) uses an approach different from the above-described measure with attention to tensile stress of the coating layer as described above, and proposes a method in which an inner coating layer having tensile stress is formed on a hard ceramic substrate, and an outer coating layer having compressive stress is formed on the inner coating layer. Further, Japanese Unexamined Patent Application Publication No. 5-177413 (Patent Document 3) proposes a cutting tool having the same constitution as in Patent Document 2 including a cermet substrate.

On the other hand, Japanese Unexamined Patent Application Publication No. 6-055311 (Patent Document 4) proposes a cutting tool including a cemented carbide substrate and a hard coating layer formed thereon by the chemical vapor deposition method, wherein the tensile stress of the hard coating layer in a rake portion is substantially removed while holding the tensile stress of the hard coating layer in a flank portion.

Further, Patent Publication No. 3087465 (Japanese Unexamined Patent Application Publication No. 6-079502, Patent Document 5) proposes a cutting tool including a titanium carbonitride-based cermet substrate and a hard coating layer formed on the surface thereof and having a compressive stress distribution substantially the same over the entirety of a cutting edge, wherein the hard coating layer is subjected to shot blasting so that the compressive stress possessed by a rake portion is 49 MPa or more higher than that possessed by a flank portion.

In each of the above proposals, both the toughness and the wear resistance can be improved to some extent, but a cutting tool is required to have higher performance under current circumstances surrounding cutting tools. Therefore, the development of a cutting tool satisfying such performance is demanded.

Patent Document 1: Japanese Unexamined Patent Application Publication No. 5-177411
Patent Document 2: Japanese Unexamined Patent Application Publication No. 5-177412
Patent Document 3: Japanese Unexamined Patent Application Publication No. 5-177413
Patent Document 4: Japanese Unexamined Patent Application Publication No. 6-055311
Patent Document 5: Patent Publication NO. 3087465 (Japanese Unexamined Patent Application Publication No. 6-079502)

DISCLOSURE OF INVENTION

Problem to be Solved by the Invention

The present invention has been achieved in consideration of the above-mentioned present conditions, and an object of the present invention is to provide a coated cutting tool satisfying high degrees of both toughness and wear resistance.

Means for Solving the Problem

As a result of intensive research for solving the problem, the inventor found that in order to satisfy both toughness and wear resistance, it is most effective to select a specified raw material for a coating covering a substrate and to apply specified stress to the coating. The further research on the basis of this finding resulted in the completion of the present invention.

The present invention relates to a coated cutting tool including a substrate and a coating formed on the substrate, wherein the coating includes a first coating composed of TiCN and a second coating composed of $\alpha$-$Al_2O_3$, the first coating is positioned between the substrate and the second coating and has tensile stress S1, and the second coating has compressive stress S2, the tensile stress S1 and the compressive stress S2 being defined by the following equation (1):

$$400 \text{ MPa} \leq |S2 - S1| \leq 3500 \text{ MPa} \qquad (1)$$

In addition, in the coated cutting tool, the ratio of surface area increase of a portion concerned in cutting may be 0.0005 to 0.07.

The first coating may have a columnar structure with an aspect ratio of 3 or more and a crystal structure with an average grain diameter of 0.05 μm to 1.5 μm. Also, the first coating may have s thickness of 2 to 20 μm, and the second coating may have a thickness of 0.5 to 20 μm.

The first coating may further contain oxygen and contain at least one element selected from the group consisting of the group IVa elements, group Va elements, and group VIa elements in the periodic table, Si, Y, B, and S. The second coating may further contain at least one element selected from the group consisting of the group IVa elements, group Va elements, and group VIa elements in the periodic table, Si, Y, B, and S.

Advantage of the Invention

The coated cutting tool of the present invention has the above-described constitution and thus satisfies high degrees of both toughness and wear resistance.

Figure 1:
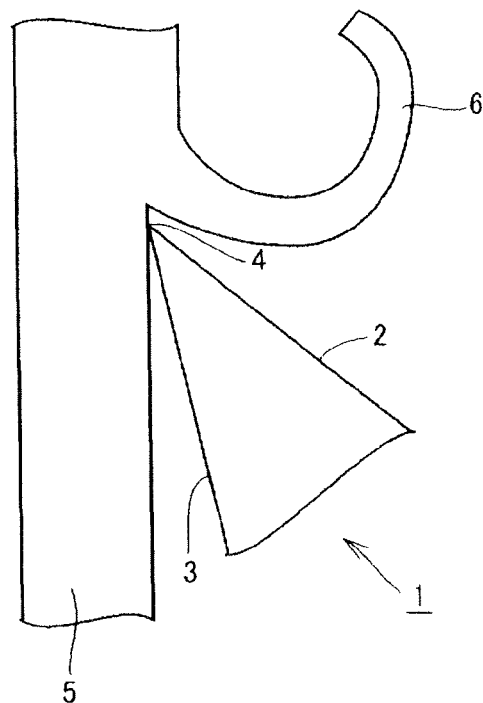
FIG. 1 is a schematic view schematically showing the contact state between a coated cutting tool and a workpiece in a cutting work.

REFERENCE NUMERALS 1 coated cutting tool, 2 rake face, 3 flank face, 4 edge line, 5 workpiece, 6 cutting chip, 7 through hole, 8 substrate, 9 coating, 10 first coating, 11 second coating.

BEST MODE FOR CARRYING OUT THE INVENTION

The present invention will be described in further detail below. An embodiment is descried below with reference to the drawings, but in the drawings of this application, the same reference numeral denotes the same or an equivalent portion.

<Coated Cutting Tool>

A coated cutting tool of the present invention includes a substrate and a coating formed on the substrate.

As shown in FIG. 1, a coated cutting tool 1 has a rake face 2 in contact with a cutting chip 6 of a work piece 5 in a cutting work and a flank face 3 in contact with the work piece. A portion corresponding to the edge at the crossing between the rake face 2 and the flank face 3 is referred to as an "edge line 4" functioning as a central point of action in cutting of the workpiece 5.

Such a coated cutting tool can be used as a drill, an end mill, an indexable insert for a drill, an indexable insert for an end mill, an indexable insert for milling, an indexable insert for turning, a metal saw, a gear cutting tool, a reamer, and a tap.

Figure 2:
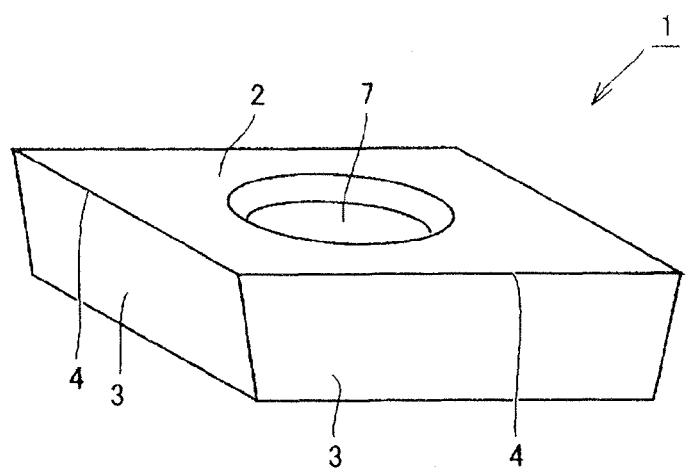
FIG. 2 is a schematic perspective view of a coated cutting tool.

For example, when the coated cutting tool 1 is used as an indexable insert, a through hole 7 can be provided at the center as shown in FIG. 2 so that the cutting tool can be attached to a tool body. In addition to or instead of the through hole 7, another fixing means may be provided according to demand.

<Substrate>

As the substrate, a commonly known substrate known as a substrate for such a cutting tool can be used without any limitation. Examples of the substrate include cemented carbides (e.g., WC-based cemented carbides and cemented carbides containing WC and Co or further containing a carbonitride of Ti, Ta, or Nb), cermet (containing TiC, TiN, or TiCN as a main component), high-speed steel, ceramics (titanium carbide, silicon carbide, silicon nitride, aluminum nitride, and aluminum oxide), sintered cubic boron nitride compacts, sintered diamond compacts, sintered silicon nitride compacts, and mixtures of aluminum oxide and titanium carbide.

In the present invention, among these various substrates, cemented carbides (WC-based cemented carbides) are particularly preferably used. This is because the cemented carbides contain high-hardness tungsten carbide as a main component and an iron group metal such as cobalt, and are thus well-balanced alloys as substrates for cutting tools having both high hardness and high strength.

<Coating>

Figure 3:
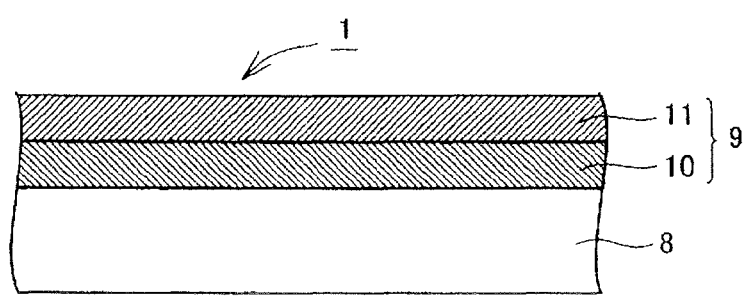
FIG. 3 is a schematic sectional view of a coated cutting tool.

As shown in FIG. 3, a coating 9 is formed on the substrate 8, mainly for the purpose of further improving toughness and further improving wear resistance. The coating 9 includes a first coating 10 composed of TiCN and a second coating 11 composed of $\alpha$-$Al_2O_3$.

Such a coating may further include a third coating other than the first and second coatings, for the purpose of further improving the adhesion between the coating and the substrate, further improving the adhesion between the first coating and the second coating, or improving the surface state of the coating.

Examples of the third coating include TiN, TiC, TiCO, TiBN, ZrCN, TiZrCN, AlN, AlON, and TiAlN.

The third coating can be formed in one layer or two or more layers, and the multilayer form thereof is not particularly limited. The third coating can be formed at least one desired multilayer point, e.g., between the substrate and the first coating, between the first coating and the second coating, or on the surface of the second coating.

<First Coating>

The first coating of the present invention is positioned between the substrate and the second coating which will be described below, is composed of TiCN, and has tensile stress S1. Since the first coating has very high hardness, the first coating exhibits the function to significantly improve wear resistance when positioned between the second coating and the substrate.

The first coating may be composed of TiCN alone but may further contain oxygen. The containing form of oxygen is not particularly limited. For example, oxygen may be contained as a substitutional element at a normal position in a TiCN crystal lattice, contained as an interstitial element between the crystal lattices, or present as an amorphous substance.

Besides oxygen, the first coating may further contain at least one element selected from the group consisting of the group IVa elements (Ti, Zr, and Hf), group Va elements (V, Nb, and Ta), group VIa elements (Cr, Mo, and W), Si, Y, B, and S. These elements can be contained together with oxygen or contained alone without oxygen, and like the oxygen, any desired containing form may be used.

Therefore, the first coating may be composed of TiCN alone or may include TiCN as a main component and the above-described elements such as oxygen.

Further, with respect to the concentration distribution of an element such as oxygen, the element may be present with any desired concentration distribution, such as a distribution in which the concentration of the element is uniform in the coating, a distribution in which the element is distributed at a high or low concentration at crystal grain boundaries, or a distribution in which the element is distributed at a high or low concentration on the surface of the coating. The content of the element such as oxygen is preferably 0.1 to 40 atomic % relative to the total of C and N of TiCN, and the upper limit and the lower limit thereof are preferably 30 atomic % and 1 atomic % and more preferably 20 atomic % and 5 atomic %, respectively. At the content less than 0.1 atomic %, the effect caused by adding the element such as oxygen (for example, micronization of crystal grains) may not be exhibited, while at the content over 40 atomic %, the crystal lattice of the film may be distorted to decrease hardness and strength.

The first coating is preferably formed to a thickness of 2 to 20 μm, and the upper and lower limits thereof are preferably 15 μm and 2.5 μm and more preferably 10 μm and 3 μm, respectively. With the thickness less than 2 μm, wearing may proceed and more significantly proceeds due to the exposure of the substrate. With the thickness of over 20 μm, the strength of the film is degraded to cause peeling and chipping of the film, finally leading to fracture.

The first coating preferably has a columnar structure with an aspect ratio of 3 or more and has a crystal structure with an average grain diameter of 0.05 μm to 1.5 μm. When the first coating has such a crystal structure, the resistance to abrasive wearing can be further improved. The aspect ratio is a value obtained by dividing the thickness of the first coating by the average grain diameter of crystals contained in the first coating, the average grain diameter being measured by the following method: A section of the first coating is mirror-processed, and crystal grain boundaries are etched. Then, the width (width of each crystal in a direction perpendicular to the thickness direction) of each crystal at a point of a ½ thickness of the first coating is measured. The average value of the widths is determined as the average grain diameter.

When such an aspect ratio is less than 3, the resistance to abrasive wear cannot be improved in some cases. Since the resistance to abrasive wear is improved as the aspect ratio increase, the upper limit thereof need not be specified. However, when the aspect ratio exceeds 300, crystals may be made excessively fine, thereby embrittling the structure and degrading the resistance to fracture. The aspect ratio is more preferably 7 to 200, and the upper limit and lower limit thereof are further more preferably 100 and 15 and particularly preferably 50 and 20, respectively.

When the average grain diameter is less than 0.05 μm, crystals may be made excessively fine, thereby embrittling the structure and degrading the resistance to fracture. When the average grain diameter exceeds 1.5 μm, the crystal structure may be coarsened, thereby degrading surface irregularity and cutting resistance such as a flow of cutting chips. The average grain diameter is preferably 0.1 μm to 1.0 μm, and the upper and lower limits thereof are preferably 0.6 μm and 0.15 μm and more preferably 0.4 μm and 0.2 μm, respectively.

The first coating preferably has tensile stress S1 as described above. The tensile stress is a type of internal stress (inherent distortion) present in the coating and represents stress expressed by a + (plus) value (unit: MPa). Therefore, the concept of high tensile stress means that the value increases, while the concept of low tensile stress means that the value decreases. The phrase "having tensile stress" includes the state in which the tensile stress is released to cause substantially no stress.

When the stress of the first coating is tensile stress, a high degree of adhesion can be achieved between the substrate and the first coating, and particularly excellent wear resistance can be realized. When the substrate is a cemented carbide, the tensile stress is preferably 5 MPa to 300 MPa.

The first coating can be formed by a known CVD method. Therefore, tensile stress can be imparted to the first coating at the same time as the formation of the first coating. On the other hand, the first coating can also be formed by a known PVD method. In this case, the coating generally has compressive stress. Therefore, in order to change compressive stress to tensile stress, it is necessary to treat the first coating by any one of various methods such as heat treatment, laser processing, and radio-frequency processing.

The stress of the first coating can be measured by a $\sin^2 \phi$ method using an X-ray stress measurement device and a TiCN (422) plane selected as a measurement diffracting plane in the same manner as for the second coating described below. Even when the first coating of the present invention further contains an element such as oxygen, stress can be measured by the same method because the (422) plane is present at substantially the same 2θ position.

<Second Coating>

The second coating of the present invention is composed of α-$Al_2O_3$ and has compressive stress S2. When the second coating is composed of such a material and is formed on the top surface or near the top surface of the substrate, it is possible to effectively prevent oxidation of the substrate and effectively prevent diffusion of the constituent elements of a work piece to the substrate side in a cutting work. Such oxidation and diffusion are accelerated by heat generation in the cutting work. However, α-$Al_2O_3$ is excellent in high-temperature stability, and thus a very excellent effect can be exhibited by synergism of these effects.

The second coating may be composed of α-$Al_2O_3$ alone but may further contain at least one element selected from the group consisting of the group IVa elements, Va elements, and VIa elements in the periodic table, Si, Y, B, and S. The containing form of the element is not particularly limited. For example, the element may be contained as a substitutional element at a normal position in the α-$Al_2O_3$ crystal lattice, contained as an interstitial element between the crystal lattices, or present as an amorphous substance.

Further, with respect to the concentration distribution of the element, the element may be present with any desired concentration distribution, such as a distribution in which the concentration of the element is uniform in the coating, a distribution in which the element is distributed at a high or low concentration at crystal grain boundaries, or a distribution in which the element is distributed at a high or low concentration on the surface of the coating. The content of the element is preferably 0.01 to 30 atomic % relative to the amount of Al of α-$Al_2O_3$, and the upper limit and the lower limit thereof are preferably 20 atomic % and 0.05 atomic % and more preferably 10 atomic % and 0.1 atomic %, respectively. At the content less than 0.01 atomic %, the effect caused by adding the element (the effect of exhibiting high hardness and high strength at high temperatures or the effect of imparting high lubricity) may not be exhibited, while at the content over 30 atomic %, the crystal lattice of the second coating may be distorted to decrease hardness and strength.

The second coating is preferably formed to a thickness of 0.5 to 20 μm, and the upper and lower limits thereof are preferably 10 μm and 1 μm and more preferably 5 μm and 1.5 μm, respectively. With the thickness less than 0.5 μm, the chemical stability of the second coating may be impaired, and thus wearing such as adhesion wear and diffusion wear may be accelerated. With the thickness of over 20 μm, the strength of the film is degraded to cause peeling and chipping of the film, finally leading to fracturing.

The second coating has compressive stress S2, and the compressive stress S2 and the tensile stress S1 of the first coating are defined by the following equation (1):

$$400 \text{ MPa} \leq |S2-S1| \leq 3500 \text{ MPa} \quad (I)$$

The compressive stress is a type of internal stress (inherent distortion) present in the coating and represents stress expressed by a "−" minus value (unit: MPa). Therefore, the concept of high compressive stress means that the value increases, while the concept of low compressive stress means that the value decreases. The phrase "having tensile stress" includes the state in which the tensile stress is released to cause substantially no stress.

When the stress of the second coating is controlled to the specified compressive stress S2, toughness can be effectively improved. In addition, the tensile stress S1 of the first coating and the compressive stress S2 of the second coating are defined as in the equation (I), and thus high levels of both toughness and wear resistance can be satisfied. When the tensile stress S1 and the compressive stress S2 are out of the range of the equation (I), high levels of toughness and wear resistance cannot be satisfied. Namely, the absolute value (|S2−S1|) of the difference between the tensile stress S1 and the compressive stress S2 is less than 400 MPa, the effect of improving toughness cannot be sufficiently achieved, while when the absolute value exceeds 3500 MPa, the second coating may be peeled from the substrate. The absolute value (|S2−S1|) is more preferably 500 MPa≤|S2−S1|≤3000 MPa . . . (1)

A method for imparting the compressive stress to the second coating of the present invention is not particularly limited. For example, the coating composed of α-Al$_2$O$_3$ is formed by a known chemical vapor deposition method (CVD method) (the coating generally has tensile stress), and the entire surface of the coating (when the third coating is formed on the second coating, the entire surface of the third coating may be processed) may be processed by any one of various methods such as brushing, blasting (including sand blasting and wet blasting), shot peening, and PVD bombardment to impart the compressive stress.

The coating composed of α-Al$_2$O$_3$ can also be formed by a known physical vapor deposition method (PVD method). In this case, the coating generally has compressive stress, but the compressive stress can be controlled by any one of various methods such as heat treatment, laser processing, and radiofrequency processing for the entire surface of the coating (when the third coating is formed on the second coating, the entire surface of the third coating may be processed).

The compressive stress S2 can be measured by a sin$^2$ φ method using an X-ray stress measurement device and an α-Al$_2$O$_3$ (116) plane selected as a measurement diffracting plane. Since the second coating has a predetermined area, the compressive stress S2 is measured by this method at desired ten points (the points are preferably selected at distances of 0.5 mm or more therebetween so that the stress measured at each point is representative of each area) in the second coating, and the average value is determined to measure the compressive stress S2 of the second coating (this method applies to the tensile stress S1 of the first coating).

The sin$^2$ φ method using an X ray is widely used as a method for measuring residual stress in a polycrystalline material. For example, the method described in detail in "X-Ray Stress Measuring Method" (The Society of Materials Science, Japan, issued by Yokendo Co., Ltd. in 1981), pp. 54-66 may be used.

In order to determine a stress value from a 2θ−sin$^2$ φ diagram as described above, the Young's modulus and Poisson's ratio of the coating are required. However, the Young's modulus can be measured with a dynamic hardness meter, and a value of about 0.2 may be used as the Poisson's ratio because the Poisson's ratio does not much vary according to materials. In the present invention, a correct stress value is not important, and thus a lattice constant and lattice spacing may be determined without using the Young's modulus to determine a stress value from the 2θ−sin$^2$ φ diagram so that the stress value can be used as an alternative value.

Even when the second coating of the present invention contains at least one element selected from the group consisting of the group IVa elements, Va elements, and VIa elements in the periodic table, Si, Y, B, and S, the stress can be measured by the same method as described above because a (116) plane is present at substantially the same 2θ position.

<Surface Roughness>

The coated cutting tool of the present invention preferably has such surface roughness that the ratio of surface area increase in a portion concerned in cutting is 0.0005 to 0.07. The upper and lower limits of the ratio of surface area increase are more preferably 0.05 and 0.001 and further preferably 0.02 and 0.005, respectively.

The ratio of surface area increase defines the surface roughness of a coating from a three-dimensional viewpoint, thus has a concept completely different from usual surface roughness Ra and Rmax which define two-dimensional surface roughness only in the height direction. In other words, the ratio of surface area increase is represented by (a1/s2)−1, i.e., a value obtained by subtracting 1 from the ratio (a1/a2) of the total surface area a1 including irregularities in all directions including the vertical direction and the horizontal direction in a predetermined measurement field of view to a two-dimensional area a2 in the same measurement field of view. The ratio indicates that smoothness is improved as the ratio of surface area increase decreases. More specifically, the ratio of surface area increase can be determined from the values measured with an electron-ray three-dimensional roughness analyzer (ERA-8000) manufactured by Elionix Co., Ltd. For example, the magnification is set to 5000 times in order to exclude macroscopic unevenness in a coating surface and permit the measurement of fine unevenness, and the surface of the coating is observed. In the measurement, the sampling numbers in the horizontal and vertical directions in a measurement field of view in a portion concerned in cutting are 280 and 210, respectively. The ratio can be measured using any measurement device as long as it is capable of measurement according to the same principle.

The ratio of surface area increase in a portion concerned in cutting, which is measured as described above, is preferably specified to 0.0005 to 0.07. When the ratio of surface area increase is a value in such a specified range, the coating surface has particularly high smoothness in a portion concerned in cutting, thereby improving the removal of chips in cutting and exhibiting the effect of suppressing a temperature rise of the rake face. This is possibly because in a cutting work, chips at a high temperature are sufficiently removed, and, accordingly, a temperature rise of the rake face is suppressed.

With the ratio of surface area increase of over 0.07, the removal property of chips is degraded, and thus the above-described effect cannot be expected. On the other hand, with the ratio of surface area increase of less than 0.0005, the effect is not so different from the above, and thus cost is required for smoothing to cause an economic disadvantage.

In order that the coated cutting tool of the present invention has surface roughness defined by the above-described ratio of surface area increase, the surface, particularly a portion concerned in cutting, is preferably processed by known polishing or smoothing. Examples of such processing include buffing, brushing, barreling, diamond lapping, and blast polishing.

The portion concerned in cutting represents a portion substantially concerned in cutting of a workpiece, and specifically represents a region having a width of at least 0.5 mm in each of the rake face direction and the flank face direction from the edge line. The maximum width of the region varies depending on the cutting depth in a cutting work as long as consideration is taken to the fact that the region is substantially concerned in cutting. Namely, a maximum value of about 10 mm may be required for the width in the rake face direction because the width in contact with a cutting chip is increased in the case of deep cutting. However, the width is usually 3 mm or less, preferably 2 mm or less, and more preferably 1.5 mm or less. On the other hand, the width in the flank face direction is little influenced by the cutting depth because the flank face does not contact a cutting chip, and thus a maximum value of 1.5 mm or less is usually sufficient. Therefore, the width of the region is particularly preferably 0.5 mm to 1.5 mm. The edge line not only means a portion (sharp edge) corresponding to the edge at the intersection of the rake face and the flank face but also includes a portion (so-called edge processed portion) in which the sharp edge is edge-processed to have radius (R) and a chamfered portion (so-called negative land portion) and a portion subjected to a combination of edge processing and chamfering.

EXAMPLES

The present invention will be described in further detail below with reference to examples, but the present invention is not limited to these examples.

Examples 1 to 5 and Comparative Examples 1 to 4

Raw material powders at the mixing ratio, 86% by mass WC, 8.0% by mass Co, 2.0% by mass TiC, 2.0% by mss NbC, and 2.0% by mass ZrC, were wet-mixed using a ball mill for 72 hours. Then, the resulting mixture was dried and press-molded. The molded product was then sintered in a vacuum atmosphere at 1420° C. for 1 hour.

The edge line of the resulting sintered compact was chamfered by SiC brush honing to form a substrate of a WC-based cemented carbide throw-away cutting tool having a tip shape of ISO SNMG120408.

Then, a coating with the constitution below was formed on the substrate surface by a chemical vapor deposition method which is a known thermal CVD method. Namely, a TiN film of 0.5 μm in thickness, a TiCN film of 5.0 μm in thickness as a first coating, a TiN film of 0.5 μm in thickness, an $\alpha$-$Al_2O_3$ film of 3.5 μm in thickness as a second coating, and a TiN film of 0.2 μm in thickness were formed on the substrate in that order to form a coated cutting tool including the substrate and the coating formed thereon. As described above, the coating included the first coating composed of TiCN and the second coating composed of $\alpha$-$Al_2O_3$, and the first coating was disposed between the substrate and the second coating.

Next, the entire surface of the coated cutting tool prepared as described above was subjected to blasting with ceramic abrasive grains of $Al_2O_3$ having a grain diameter of 250 μm or less under the conditions a blasting pressure of 0.01 to 0.5 MPa, a blasting distance of 0.5 to 200 mm, and a fine concentration of 5 to 40 vol % to impart each of the stress values (tensile stress S1 of each first coating, compressive stress S2 of each second coating, and the absolute value of the difference |S2−S1|) as shown in Table I.

Each of the stress values (particularly, compressive stress S2 of each second coating, and the absolute value of the difference |S2−S1|) was controlled by appropriately controlling the blasting conditions within the above-described respective ranges, and measured by the $\sin^2 \phi$ method.

The coated cutting tools of Examples 1 to 5 of the present invention and the coated cutting tools of Comparative Examples 1 to 4 were formed as described above. In each of the coated cutting tools of Examples 1 to 5 of the present invention, the first coating had tensile stress S1, the second coating had compressive stress S2, and the tensile stress S1 and the compressive stress S2 were defined by the above-described equation (1).

As a result of measurement by the above-described method, the first coating of each of the coated cutting tools of Examples 1 to 5 had a columnar structure with an aspect ratio of 17 and a crystal structure with an average grain diameter of 0.3 μm.

Then, a turning test was carried out for each of these coated cutting tools under the conditions below to measure a time (tool life) until fracturing occurred. A long time until the occurrence of fracturing indicates excellent toughness and wear resistance.

<Test Conditions>
Workpiece: SCM435 grooved round rod
Cutting speed: 230 m/min
Feed: 0.15 mm/rev.
Depth of cutting: 1.0 mm
Cutting oil: no

TABLE I

|  | Tensile stress of first coating (S1) | Compressive stress of second coating (S2) | |S2−S1| | Tool life |
|---|---|---|---|---|
| Example 1 | 44 MPa | −560 MPa | 604 MPa | 23 min |
| Example 2 | 40 MPa | −1250 MPa | 1290 MPa | 27 min |
| Example 3 | 181 MPa | −1250 MPa | 1431 MPa | 29 min |
| Example 4 | 9 MPa | −2600 MPa | 2609 MPa | 36 min |
| Example 5 | 10 Mpa | −3020 MPa | 3030 MPa | 24 min |
| Comparative Example 1 | 210 MPa | 220 MPa | 10 MPa | 2 min |
| Comparative Example 2 | 134 MPa | 290 MPa | 156 MPa | 5 min |
| Comparative Example 3 | 250 MPa | −45 MPa | 295 MPa | 7 min |
| Comparative Example 4 | 112 MPa | −3568 MPa | 3680 MPa | 3 min |

Table I indicates that the coated cutting tools in each of which the absolute value of the difference (|S2−S2|) between the tensile stress S1 and the compressive stress S2 is 400 MPa to 3500 MPa as shown in the equation (I) (Examples 1 to 5) satisfy high degrees of both toughness and wear resistance in comparison to the coated cutting tools in each of which the absolute value of the difference is out of the range (Comparative Examples 1 to 4).

On the other hand, for the coated cutting tool of Example 3 formed as described above, smoothing was carried out in a region (i.e., a portion concerned in cutting) extending with a width of 0.5 mm from the edge line in each of the rake face direction and the flank face direction using diamond abrasive grains with different grain sizes (#1000 to #3000) and different lapping times as shown in Table II (Examples 3-1 to 3-6). In each of the coated cutting tools, the surface roughness of the portion concerned in cutting was measured using an electron-ray three-dimensional roughness analyzer (ERA-8000 manufactured by Elionix Co., Ltd.). As a result, the ratio of surface area increase was as shown in Table II.

Then, a turning test was carried out for each of these coated cutting tools under the same conditions as described above to measure a time (tool life) until fracturing occurred. The results are shown in Table II.

TABLE II

|  | Grain size of diamond abrasive grain | Lapping time | Ratio of surface area increase | Tool life |
| --- | --- | --- | --- | --- |
| Example 3-1 | #3000 | 500 min | 0.0007 | 52 min |
| Example 3-2 | #2500 | 60 min | 0.008 | 51 min |
| Example 3-3 | #2000 | 40 min | 0.017 | 49 min |
| Example 3-4 | #1500 | 20 min | 0.045 | 45 min |
| Example 3-5 | #1000 | 20 min | 0.065 | 41 min |
| Example 3-6 | #1000 | 0.5 min | 0.08 | 28 min |

Table II indicates that in a coated cutting tool, as the ratio of surface area increase in a portion concerned in cutting decreases, the tool life is improved, and high degrees of both toughness and wear resistance are satisfied.

It should be thought that the embodiment and all examples disclosed herein are illustrative in all respects and not limitative. It is intended that the scope of the present invention is indicated by the claims, not the above description, and includes meanings equivalent to the claims and any modification within the scope.

The invention claimed is:

1. A coated cutting tool comprising a substrate, comprising cemented carbides, and a coating formed on the substrate,
wherein the coating includes a first coating composed of TiCN and a second coating composed of $\alpha$-Al2O3,
both the first and second coatings are formed by a chemical vapor deposition (CVD) method,
the first coating is positioned between the substrate and the second coating and has tensile stress S1,
the second coating has compressive stress S2,
the tensile stress S1 is 5 MPa to 300 MPa, and
the tensile stress S1 and the compressive stress S2 are defined by the following equation (I):

$$400 \text{ MPa} \leq |S2-S1| \leq 3500 \text{ MPa} \tag{I}$$

2. The coated cutting tool according to claim 1, wherein the ratio of surface area increase of a portion concerned in cutting is 0.0005 to 0.07.

3. The coated cutting tool according to claim 1, wherein the first coating has a columnar structure with an aspect ratio of 3 or more and a crystal structure with an average grain diameter of 0.05 μm to 1.5 μm.

4. The coated cutting tool according to claim 1, wherein the first coating has a thickness of 2 to 20 μm, and the second coating has a thickness of 0.5 to 20 μm.

5. The coated cutting tool according to claim 1, wherein the first coating further contains oxygen.

6. The coated cutting tool according to claim 1, wherein the first coating further contains at least one element selected from the group consisting of the group IVa elements, group Va elements, and group VIa elements in the periodic table, Si, Y, B, and S.

7. The coated cutting tool according to claim 1, wherein the second coating further contains at least one element selected from the group consisting of the group IVa elements, group Va elements, and group VIa elements in the periodic table, Si, Y, B, and S.

* * * * *